(12) United States Patent
Chen et al.

(10) Patent No.: US 6,787,926 B2
(45) Date of Patent: Sep. 7, 2004

(54) WIRE STITCH BOND ON AN INTEGRATED CIRCUIT BOND PAD AND METHOD OF MAKING THE SAME

(75) Inventors: Chih-Chiang Chen, Hsinchu (TW);
Pei-Haw Tsao, Taichung (TW);
Chung-Yu Wang, Jung-He (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 31 days.

(21) Appl. No.: 09/947,064

(22) Filed: Sep. 5, 2001

(65) Prior Publication Data

US 2003/0042621 A1 Mar. 6, 2003

(51) Int. Cl.[7] .................................. H01L 23/48
(52) U.S. Cl. .................. 257/784; 257/786; 174/258; 438/617
(58) Field of Search ................. 257/786, 784, 257/700, 723, 724, 686, 777; 174/256, 258, 260; 438/125, 617, 123

(56) References Cited

U.S. PATENT DOCUMENTS

| | | | | |
|---|---|---|---|---|
| 4,541,169 A | * | 9/1985 | Bartush .................. 438/620 |
| 5,012,323 A | * | 4/1991 | Farnworth ................ 357/75 |
| 5,311,057 A | * | 5/1994 | McShane .................. 257/676 |
| 5,422,435 A | * | 6/1995 | Takiar et al. ............. 174/52.4 |
| 5,528,083 A | * | 6/1996 | Malladi et al. ............. 257/786 |
| 5,562,837 A | * | 10/1996 | De Givry .................... 216/18 |
| 5,770,889 A | * | 6/1998 | Rostoker et al. ........... 257/698 |
| 5,801,927 A | * | 9/1998 | Watanabe .................... 361/777 |
| 5,953,213 A | * | 9/1999 | Napierala ................... 361/760 |
| 5,960,262 A | * | 9/1999 | Torres et al. ............... 438/123 |
| 6,222,260 B1 | * | 4/2001 | Liang et al. ................. 257/691 |
| 6,244,498 B1 | * | 6/2001 | Jiang et al. .............. 228/180.5 |
| 6,376,904 B1 | * | 4/2002 | Haba et al. ................. 257/686 |
| 6,407,456 B1 | * | 6/2002 | Ball .......................... 257/777 |
| 6,489,572 B2 | * | 12/2002 | Ho et al. ..................... 174/259 |

* cited by examiner

Primary Examiner—David Nelms
Assistant Examiner—Lourdes (Elle) Cruz
(74) Attorney, Agent, or Firm—Tung & Associates

(57) ABSTRACT

A microelectronic assembly, and method of making the same, including a wire stitch bonded on an electroplated gold bump or electroless nickel/gold bump on a bond pad of an integrated circuit chip. The electroplated gold bump or electroless nickel/gold bump provides a relatively flat upper surface which is excellent for making a wire stitch bond thereto. The microelectronic assembly may include a multiple integrated circuit chip stack attached to a substrate such as a ball grid array. The electroplated gold bumps or electroless nickel/gold bumps may be formed on all of the integrated circuit chips and wire stitch bonds formed on the electroplated gold bumps or electroless nickel/gold bumps thereby connecting the integrated circuit chips to each other or to an underlying ball grid array.

24 Claims, 4 Drawing Sheets

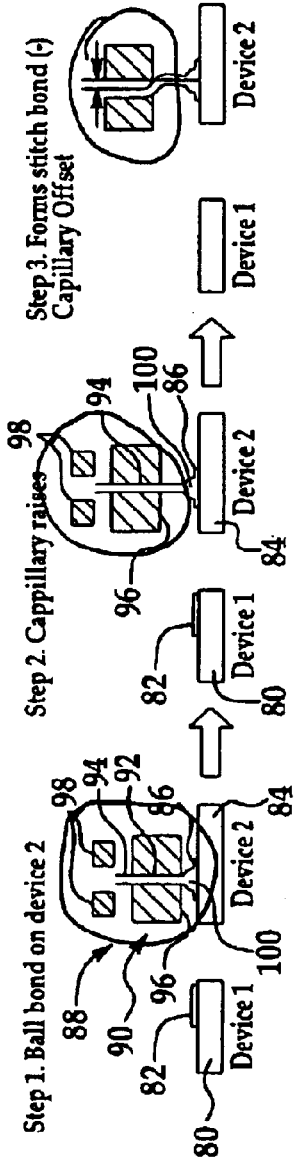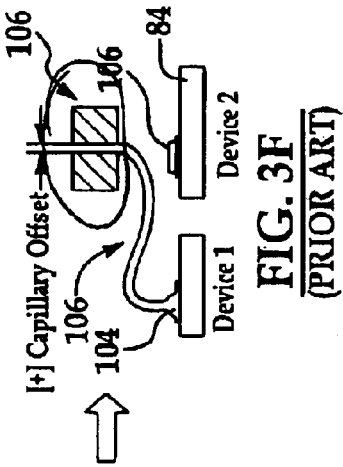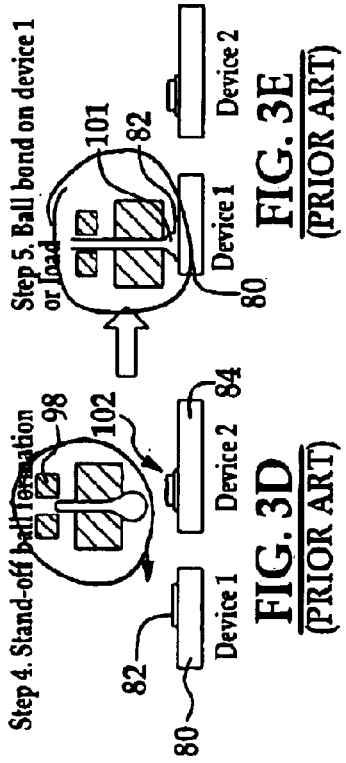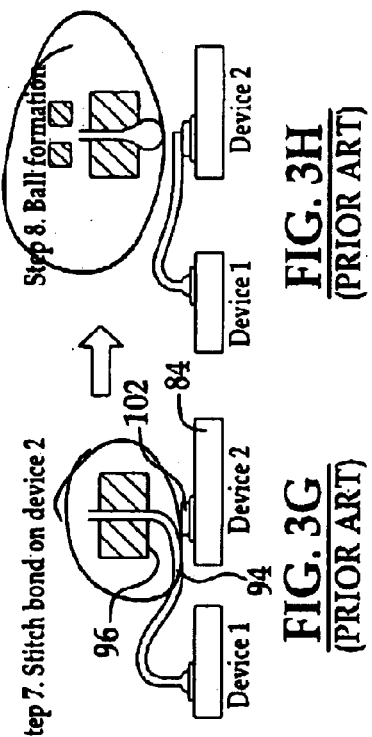

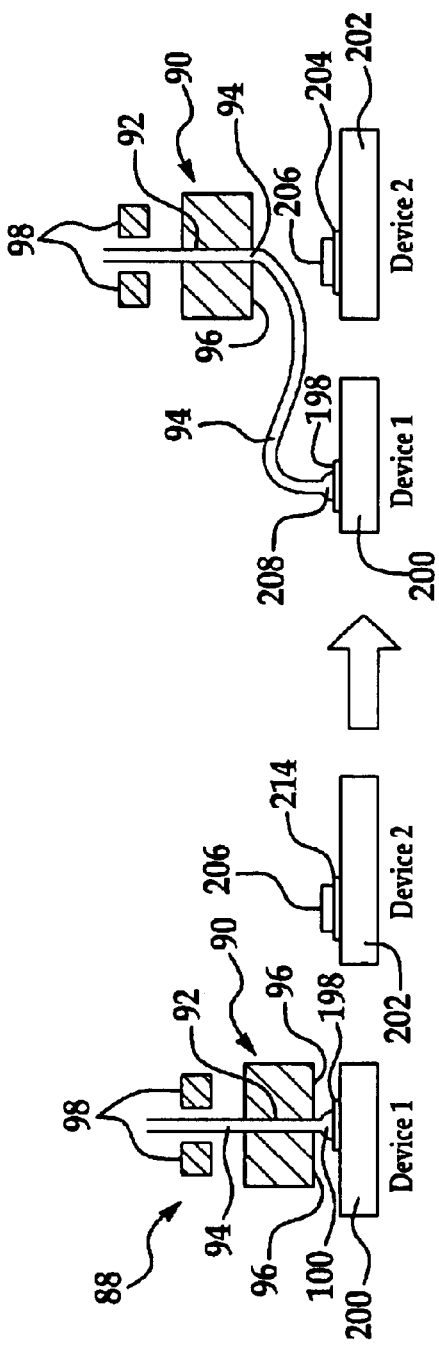
FIG. 7A
FIG. 7B
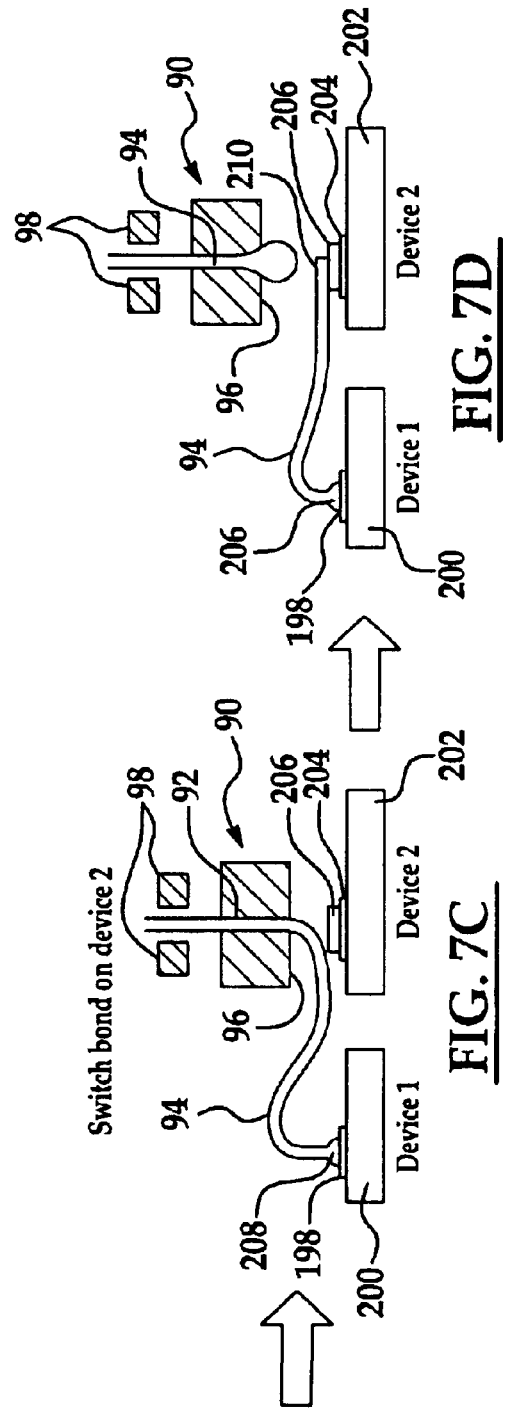
FIG. 7C
FIG. 7D

WIRE STITCH BOND ON AN INTEGRATED CIRCUIT BOND PAD AND METHOD OF MAKING THE SAME

FIELD OF THE INVENTION

This invention relates to wire bond interconnects for integrated circuit chips, and more particularly to a wire bond interconnect using a stitch bond on an integrated circuit chip pad.

BACKGROUND OF THE INVENTION

A variety of interconnects systems for making electrical connection between a substrate and an integrated circuit chip, and between integrated circuit chips in a multiple chip stacked assembly. Warren, U.S. Pat. No. 5,905,639, issued May 18, 1999, discloses a three-dimensional circuit structure that interconnects an integrated circuit chip, along with additional active devices and passive components, to a substrate by way of a high-density multichip interconnect decal disposed on the integrated circuit chip. The three-dimensional circuit structure includes the substrate, integrated circuit chip attach to the top of the substrate, and high-density multichip interconnect decal attached to the integrated circuit chip. One or more passive components and relatively small active devices are attached to the top of the high-density multichip interconnect decal. A plurality of the three-bond, daisy-chained wedge bonds are used to interconnect active devices and passive components to the substrate by way of the high-density multichip interconnect decal. Each wedge bond includes a wire that is initiated at the high-density multichip interconnect decal bond pad, an intermediate stitch bond at the integrated circuit chip bond pad, and terminates at the substrate bond pad.

Lake et al., U.S. Pat. No. 6,114,239, issued on Sep. 5, 2001, discloses an integrated circuit chip die pad. A supporting substrate includes circuit traces fabricated from an electrically conductive material such as copper. Exposed aluminum on the die pad is electroless copper plated to form a copper layer. Electroless copper plating is well known to those skilled in the art. This reference indicates that although copper is the metal of choice in the preferred embodiments, other conductive metals may be used in place of the copper. A conductive epoxy is formulated to have a copper oxide reducing agent and is applied to the copper layer overlying the contact. The copper layer forms in interface layer on the aluminum contact area in order to provide a desired surface for the conductive epoxy. The conductive layer and the contact area form the metal bond pad portion and the conductive epoxy forms the conductive epoxy portion of the electrical bonding interconnect. This reference also indicates that a metal other than copper may be plated onto the contact area, and in such case the oxide reducing agent in the conductive epoxy is selected to reduce the oxides formed before and/or during the process. The integrated circuit chip die pad is positioned over a supporting substrate such that the contact areas on both are aligned. The cured epoxy functions as a standoff between the die pad and the substrate. The epoxy is then cured, binding the die pad and the substrate together. A wire bond may be used to electrically connect the supporting substrate to an external electrical connection.

Liao et al., U.S. Pat. No. 6,075,281, issued on Jun. 13, 2000, discloses lead fingers that have inclined tip portions for achieving an improved wire bond. The inclined tip portions of the lead fingers can be formed in a stamping process with an angle on the top surface of the inclined tip portions measured at smaller than 30° from a horizontal plane of the lead finger. The inclined angle should be between about 5° and about 30°, and more preferably the angle should be between about 5° and about 20°. A wedge bond is formed on the inclined tip portion of the lead finger having improved thickness and thermal stress endurance. The thermal stress endurance may be improved by at least 20% and preferably at least 50% when tested in a thermal cycling test between 150° C. and −65° C. A wire bonding ball is formed on the bonding pad of the integrated circuit chip.

Ball, U.S. Pat. No. Re 36,613, discloses a stacked integrated circuit chip die device mounted on a paddle with the integrated circuit chip dies adhesively connected to each other by a controlled thickness thermoplastic adhesive layer. A group of four dies are attached to the paddle by a controlled adhesive layer. Each of the die bonding pads in double rows are electrically connected to multiple lead fingers by thin gold or aluminum wire, with gold being the preferred metal. The critical bonding method used at the die end pads is an ultrasonic ball bond as named by the shape of the bond. The other end of the gold wire is attached to a lead finger by a wedge bond, which is also an ultrasonic bond wherein ultrasonic energy is used to heat the wire as it is compressed against the lead finger. This reference indicates that a wedge bond is not used on the integrated circuit chip die because the bonding machine contacts the bonding surface and could damage this critical surface.

Other methods of making wire interconnects between a substrate and an integrated circuit chip, and in particularly between integrated circuit chips in on a multichip stacked device are known to those skilled in the art. FIG. 1 illustrates a prior art multichip stacked device 8 including a first integrated circuit chip 10 stacked on top of a second integrated circuit chip 12 and with an adhesive layer 14 securing the chips 10, 12 together. The stacked chips 10, 12 are attached to an underlying first substrate 16 which in this case is a ball grid array. First and second bond pads 20, 22 are provided on the first substrate 16. A first wire 24 is connected from the first substrate 16, wherein the first wire 24 has a wire ball bond 26 connected to the first bond pad 20 and a stitch bond 28 connected to a wire bond stud bump 30 formed on a bond pad 32 of the first integrated circuit chip 10. A second wire 34 includes a ball bond 28 connected to a bond pad 40 on the second integrated circuit chip 12 and a stitch bond 36 formed on the second bond pad 22 of the first substrate 16. Forming a stitch bond on the integrated circuit chips 10, 12 is avoided in order to eliminate the risk of causing damage to the chips by forming a stitch bond on a bond pad of a chip because stitch bonding uses ultrasonic vibration and pressure.

FIG. 2 illustrates a second multichip stacked device 42 which also includes a first integrated circuit chip 44 stacked on top of a second integrated circuit chip 46 with a first adhesive layer 48 securing the two chips together. The stacked integrated circuit chips 44, 46 are secured to a substrate 50 which in this case is a standard printed wire board. Similar to FIG. 1, wires 52, 54 are provided between the substrate 50 and the second integrated circuit chip 44. The first wire 52 includes a stitch bond 56 formed on a wire stud bump 57 formed on contact pad 59 of the second integrated circuit chip 44 and a ball bond 58 formed on a bond pad provided on the substrate 50. The second wire 54 provides a stitch bond 60 formed on a bond pad provided on the first substrate 50 and a ball bond 62 on a first integrated circuit chip 44. Wires 62, 64 are provided between the first integrated circuit chip 44 and the second integrated circuit chip 46. The first wire 62 includes a ball bond 72 formed on a bond pad 74 of the second integrated circuit chip 46. The other end of the wire 62 has a stitch bond 75 connected to the wire stud bump 77 formed on a bond pad 78 of the first integrated circuit chip 44. The second wire interconnects 64 includes a stitch bond 66 formed on a wire stud bump 68 on a contact pads 70 of the second integrated circuit chip 66, and the other end of the second wire interconnect 64 includes a ball bond 68 formed on a contact pad 70 on the first integrated circuit chip 44.

FIGS. 3A–H illustrate the steps of a prior art method of making a wire interconnect between two integrated circuit chips. A first semiconductor device 80 is provided having a contact pad or bond pad 82 thereon. A second semiconductor device 84 is provided also having a bond pad 86 formed thereon. A wire bonding apparatus 88 is provided having a capillary 90 that is generally cone shaped and having a through hole 92 formed therethrough through which a wire 94 may be fed by a mechanism known to those skilled in the art (not shown). The capillary 90 includes a nose 96 which will be used to form ball bonds and stitch bonds as will be described hereafter. The wire bonding apparatus 88 also may include a wire clamp 98 which is constructed and arranged to grab hold of the wire and prevent the wire from being fed out the end of the capillary 90. As shown in FIG. 3A, a ball bond 100 formed at the end of the wire 94 is pressed against the bond pad 86 of the second semiconductor device 84. The ball is formed at the end of the wire by heating the tip of the wire as will be discussed hereafter. Pressure is applied by the capillary and heat provided either by heating the capillary or using an a light ultrasonic scrubbing action to form a bond between the ball 100 and the underlying bond pad 86. As shown in FIG. 2B, after the bond is formed the capillary is raised away from the substrate and wire 94 is fed out of the capillary 90. Thereafter, the wire 94 may be detached from the ball bond 100 using cutters. Alternatively as shown in FIG. 3C, the capillary is laterally offset in one direction from an the ball bond 100. As shown in FIG. 3D the wire clamp 98 grips the wire 94 preventing the wire from being fed out the end of the capillary, and the capillary 90 is moved further in the lateral direction to break off the wire from the ball bond leaving a wire bond stud bump 102. A small length of wire is then fed out of the end of the capillary and heated with a flame or electronic spark to form a ball at the end of the wire 94. The ball 101 is pressed against the bond pad 82 of the first semiconductor device 80, and heat is applied through the capillary 90 or by a light ultrasonic scrubbing action to form a ball bond 104 on the bond pad 82 as shown in FIG. 3D. As can be seen in FIG. 3F, the capillary 90 is raised off of the ball bond 104 and a wire loop 106 is provided so that the capillary 90 is positioned slightly offset from the stud bump 102 on the second semiconductor device 84. The capillary 90 is lowered so that the nose 96 presses a portion of the wire 94 against the stud bump 102 on the second device 84. The capillary 90 is ultrasonically vibrated to form a stitch or wedge bond between the wire 94 and the stud bump 102. Thereafter, the wire clamp 98 is closed to clamp onto the wire and the capillary 90 is raised to break the wire off leaving a wedge bond 108 on the stud bump 102. This method avoids damage to the semiconductor device 84 that might be caused by directly ultrasonically wire bonding to the bond pad 86 on the semiconductor device. However, the stud bump 102 does not have a flat upper surface and therefore it is very difficult to form a wedge bond onto the stud bump 102. Further, forming the stud bump 102 is an additional step in the process adding cost and the potential for process errors. Therefore it would be desirable to provide a method of forming a bond on a substrate, such as an integrated circuit chip without using the stud bump process.

The present invention overcomes deficiencies in the prior art, and provides alternatives and advantages thereto.

SUMMARY OF THE INVENTION

One embodiment of the invention is a microelectronic assembly including a first semiconductor device having a first bond pad formed thereon, and a raised electrical contact feature or bump formed over the first bond pad and a first wire having a first end stitch bonded to the bump, and wherein the raised feature is selected from the group consisting of an electroplated gold bump and electroless nickel/gold bump.

In another embodiment of the invention the first semiconductor device is a first integrated circuit chip.

Another embodiment of the invention further includes a first substrate having a first bond pad formed thereon, and wherein the first wire includes a second end bonded to the first bond pad on the first substrate.

Another embodiment of the present invention further includes a second semiconductor device having a first bond pad formed thereon, and wherein the first wire includes a second end bonded to the first bond pad on the second semiconductor device.

In another embodiment of the invention the second semiconductor device includes a second integrated circuit chip.

Another embodiment of the present invention further includes a bump formed on the second bond pad and wherein the bump is selected from the group consisting of an electroplated gold bump and an electroless nickel/gold bump.

In another embodiment of the invention the first wire includes a second end stitch bonded to the raised feature on the second integrated circuit chip.

Another embodiment of the present invention further comprises a first substrate having a first bond pad formed thereon and wherein the first wire includes a second end bonded to the first bond pad on the first substrate.

In another embodiment of the present invention the first substrate comprises a ball grid array.

Another embodiment of the present invention further includes a second semiconductor device attached to the first semiconductor device, and wherein the second semiconductor device includes a first bond pad formed thereon, and a raised electrical contact feature formed on the first bond pad on the second semiconductor device, and wherein the raised feature is selected from the group consisting of an electroplated gold bump and an electroless nickel/gold bump.

An another embodiment of the present invention the first wire further includes a second end stitch bonded to the raised feature on the second semiconductor device.

Another embodiment of the present invention further includes a first substrate, and wherein the first and second semiconductor devices are mounted on the first substrate.

In another embodiment of the present invention the first substrate further includes a first bond pad formed thereon and wherein the first wire includes a second end bonded to the first bond pad on the first substrate.

In another embodiment of the present invention a second wire is also provided having a first end stitch bonded to the bump on the second semiconductor device.

In another embodiment of the invention the second wire further includes a second end bonded to the first bond pad on the first substrate.

In another embodiment of the invention the second end of the wire is ball bonded to the first bond pad on the first substrate.

In another embodiment of the invention the second end of the second wire is wedge bonded to the first bond pad on the first substrate.

In another embodiment of the present invention the second semiconductor device includes an integrated circuit chip.

In another embodiment of the present invention the first wire further includes a second end ball bonded to the raised feature on the second semiconductor device.

In another embodiment of the invention the first wire includes a gold based material.

In another embodiment of the invention the second wire includes a gold based material.

Another embodiment of the invention is a method of making a microelectronic assembly including the steps of providing a first semiconductor device having a first bond pad formed thereon, and a first raised electrical contact feature overlying the first bond pad, and wherein the first raised feature is selected from the group consisting of an electroplated gold bump and an electroless nickel/gold bump. The first end of a wire is stitch bonded to the first raised feature on the first semiconductor device.

In another embodiment of the present invention the first semiconductor device includes a semiconductor chip.

In another embodiment of the invention a second semiconductor device is also provided having a first bond pad formed thereon and a second raised electrical contact feature overlying the first bond pad on the second semiconductor device and wherein the second raised feature is selected from the group consisting of an electroplated gold bump and an electroless nickel/gold bump. The second end of the first wire is stitch bonded to the second raised feature.

In another embodiment of the present invention the first semiconductor device includes a first integrated circuit chip and wherein the second semiconductor device includes a second integrated circuit chip.

In another embodiment of the invention the method further includes a second semiconductor device having a first bond pad formed thereon, and wherein the wire includes a second end ball bonded to the first bond pad on the second semiconductor device.

In another embodiment of the invention the first semiconductor device includes a integrated circuit chip.

In another embodiment of the invention the second semiconductor device includes a second integrated circuit chip.

In another embodiment of the present invention the first integrated circuit chip and the second integrated circuit chip are attached to each other in a stacked relationship.

Another embodiment of the invention includes a method of making a microelectronic assembly including the steps of providing a wire bonding apparatus including a capillary having a through hole formed therethrough for receiving a wire to be fed out of the capillary, and the capillary further including a nose portion. A first integrated circuit chip is provided having a first bond pad formed thereon. A second integrated circuit chip is also provided having a first bond pad formed thereon and a raised electrical contact feature overlying the first bond pad on the second integrated circuit chip, and wherein the raised feature includes an electroplated bump including gold or an electroless bump including a first layer including nickel and a second layer including gold. A ball is formed at the first end of the wire by heating the first end of the wire. The capillary is lowered so that the ball on the first end of the wire contacts the first bond pad on the first integrated circuit chip. Heat and pressure are applied to the ball on the first end the wire to form a ball bond on the first bond pad of the first integrated circuit chip. The capillary is raised and moved to a position slightly offset from the raised feature on the second integrated circuit chip and wire is fed out of the capillary at the same time to provide a wire loop. The capillary is lowered so that the nose of the capillary presses a portion of the wire against the raised feature and the capillary is ultrasonically vibrated to form a stitch bond between the wire and raised feature. Thereafter, the wire is detached from the stitch bond.

In another embodiment of the invention the step of applying heat and pressure to the ball on the first end of the wire to form a ball bond includes ultrasonically vibrating the capillary.

In another embodiment of the present invention the wire bonding apparatus further includes a wire clamp for grabbing onto the wire and preventing wire from being fed out of the capillary. The step of detaching the wire from the stitch bond includes closing the wire clamp and grabbing the wire and moving the capillary away from the stitch bond to break the wire.

In another embodiment of the present invention the first integrated circuit chip and the second integrated circuit chip are attached to each other in a stacked relationship.

Another embodiment of the present invention includes a method of making a microelectronic assembly including the steps of providing a wire bond apparatus including a capillary having a through hole formed therethrough for receiving a wire and feeding the wire out of the capillary. The capillary further comprises a nose portion. A first integrated circuit chip is provided having a first bond pad formed thereon, and a first raised electrical contact feature overlying the first bond pad on the first integrated circuit chip. The first raised feature includes an electroplated bump including gold or an electroless bump having a first layer including nickel and a second layer including gold. The capillary is lowered so that the nose portion presses a portion of the wire against the first raised feature and the capillary as ultrasonically vibrated to form a stitch bond on the first raised feature. The capillary is raised and moved to a position slightly offset from a second raised electrical contact feature while at the same time wire is being fed out of the capillary. The capillary is lowered so that the nose portion of the capillary presses a portion of the wire against a second raised feature and the capillary is ultrasonically vibrated to form a stitch bond on the second raised feature. Thereafter, the wire is detached from the stitch bond on the second raised feature.

In another embodiment of the present invention the wire bonding apparatus further includes a wire clamp for grabbing hold of the wire and preventing wire from being fed out of the capillary. The step of detaching the wire from the stitch bond formed on the second raised feature includes closing the wire clamp to grab hold of the wire and moving the capillary to break the wire.

These and other objects, features and advantages of the present invention will become apparent from the following brief description of the drawings, detailed description of the preferred embodiments, and appended claims and drawings.

BRIEF DESCRIPTION OF THE DRAWINGS

FIG. 3A illustrates a prior art step of forming a ball bond on an integrated circuit chip bond pad;

FIG. 3B illustrates a prior art step of raising a capillary off of a ball bond formed on an integrated circuit chip shown in FIG. 3A;

FIG. 3C illustrates a prior art step of laterally moving the capillary to an offset positioned from the ball bond formed on the integrated circuit chip in FIG. 3B;

FIG. 3D illustrates a prior art step of detaching the wire from the ball bond shown in FIG. 3C to form a wire stud bump on the integrated circuit chip;

FIG. 3E illustrates a prior art step of forming a ball bond on a second integrated circuit chip;

FIG. 3F illustrates a prior art step of an moving the capillary laterally from the ball bond formed on the second integrated circuit chip to a position slightly offset from the stud bump formed on the first integrated circuit chip;

FIG. 3G illustrates a prior art step of forming a stitch bond on the stud bump formed on the first integrated circuit chip;

FIG. 3H illustrates a prior art step of detaching the wire from the wire stitch bond formed in FIG. 3G.

FIG. 7A illustrates the step of forming a ball bond on a bond pad of a first integrated circuit chip according to the present invention;

FIG. 7B illustrates the step of laterally moving the capillary of a wire bond apparatus away from the ball bond formed on the first integrated circuit chip to a positioned over an electroplated gold bump or electroless nickel/gold bump formed on the bond pad of the second integrated circuit chip according to the present invention;

FIG. 7C illustrates the step of forming a wire stitch bond on the electroplated gold bump or electroless nickel/gold bump according to the present invention; and FIG. 7D illustrates the step of detaching the wire from the wire stitch bond formed on the electroplated gold bump or electroless nickel/gold bump.

DETAILED DESCRIPTION OF THE PREFERRED EMBODIMENTS

Figure 1:
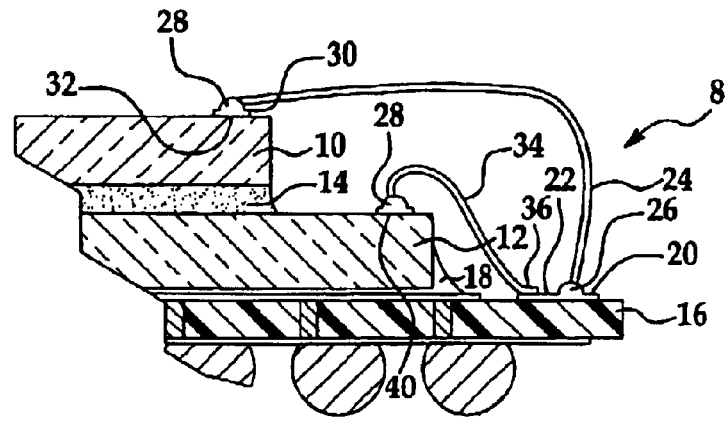
FIG. 1 illustrates a prior art multiple chip stacked device.
Figure 2:
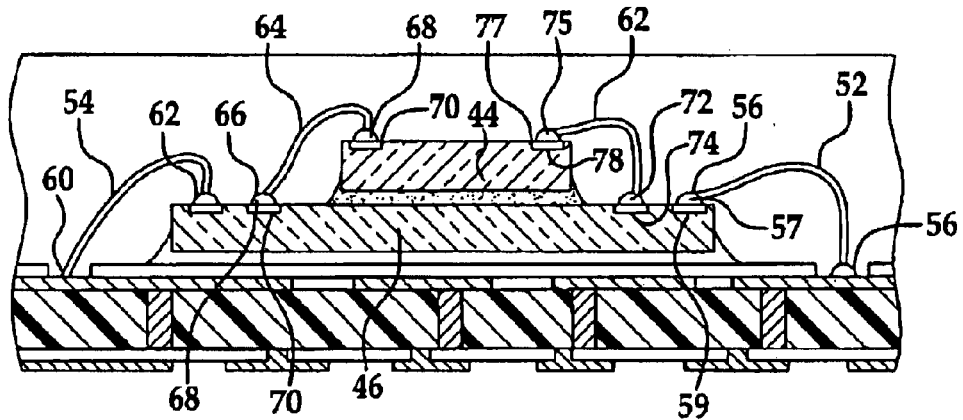
FIG. 2 illustrates a prior art multiple chip stacked device.
Figure 4:
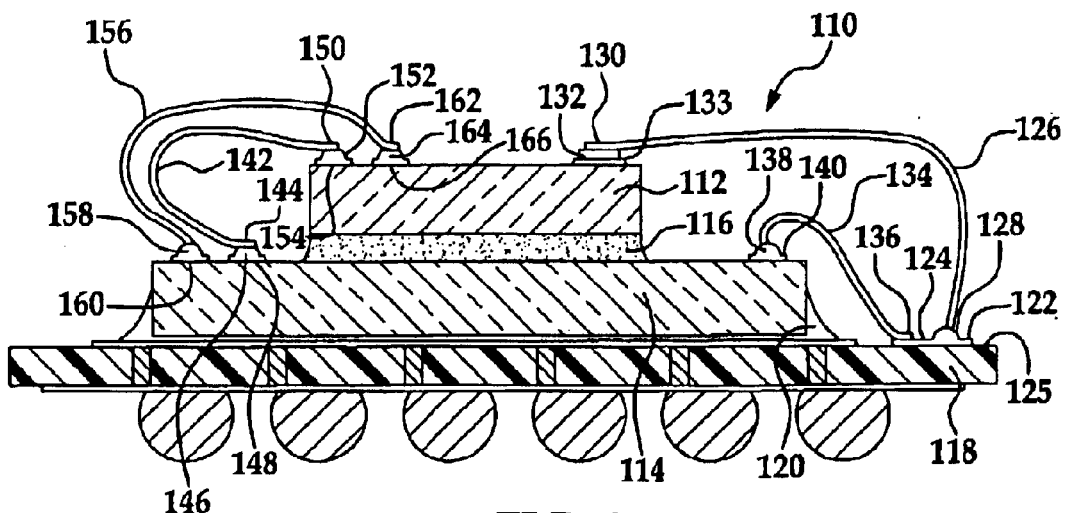
FIG. 4 illustrates a multiple chip stacked assembly according to the present invention.

FIG. 4 illustrates a multiple chip stacked assembly 110 according to the present invention. The multiple chip stacked assembly 110 includes a first semiconductor device such as an integrated circuit chip 112 stacked on top of a second semiconductor device such as an integrated circuit chip 114 and wherein the first and second integrated circuit chip 112, 114 are secured together by a first adhesive layer 116. The first and second integrated circuit chips 112, 114 are secured by a second adhesive layer 120 to a first substrate 118, which in this case is a ball grid array. The first substrate 118 includes a first bond pad 122 and a second bond pad 124 formed at an upper surface 125 thereof. A first wire 126, preferably a gold based wire, is provided having a ball bond 128 formed on the first bond pad 120 to a first substrate 118. The other end of the wire 126 is stitch bonded 130 to a first electroplated gold bump 132 formed on a first bond pad 133 on the first integrated circuit chip 112. A second wire 134, again preferably a gold based wire, has a first end with a stitch or wedge bond 136 formed on the second bond pad 120 formed on the upper surface of the first substrate 118. The other end of the second wire 134 includes a ball bond 138 formed on the first bond pad 140 on the second integrated circuit chip 114. A third wire 142 is provided having a stitch bond 144 at one end of the wire connecting the wire to an underlying electroless nickel/gold bump 146 formed on a second bond pad 148 of the second integrated circuit chip 114. The opposite end of the third wire 142 is stitch bonded to an underlying electroplated gold bump 152 formed on a second bond pad 154 of the first integrated circuit chip 112. A fourth wire 156 is provided having a first end forming a ball bond 158 on a bond pad formed on the second integrated circuit chip 112. The other end of the fourth wire 156 is stitch bonded 162 on an electroless nickel/gold bump formed on a third bond pad 166 on the first integrated circuit chip 112. As will be appreciated the use of electroplated gold bumps and/or electroless nickel/gold bumps provides a relatively level upper surface onto which a wire stitch bond may be easily formed. As such, a wire connection may be easily made between stacked integrated circuit chips or between substrates and the electroplated gold bump or electroless nickel/gold bump on a bond pad of an integrated circuit chip.

Figure 5A:
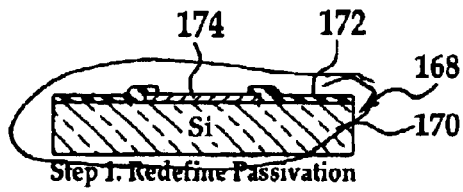
FIG. 5A illustrates a step of providing a semiconductor device for use in a method according to the present invention.
Figure 5B:
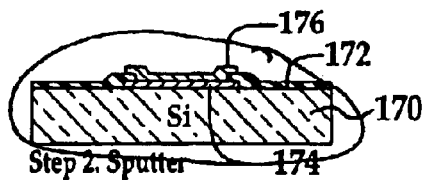
FIG. 5B illustrates the step of providing a contact metal over the bond pad on the integrated circuit chip of FIG. 5A according to the present invention.
Figure 5C:
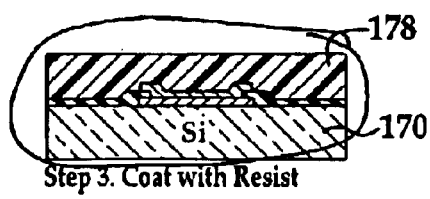
FIG. 5C illustrates the step of coating the integrated circuit chip with a photoresist according to the present invention.
Figure 5D:
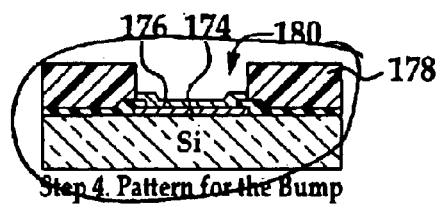
FIG. 5D illustrates the step of patterning the photoresist to provide an opening over the bond pad on the integrated circuit chip according to the present invention.
Figure 5E:
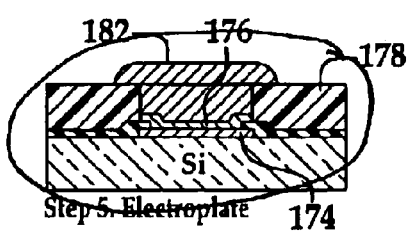
FIG. 5E illustrates the step of the electroplating gold into the opening in the photoresist and over the bond pad on the integrated circuit chip according to the present invention.
Figure 5F:
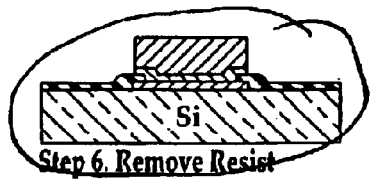
FIG. 5F illustrates a step of removing the photoresist and optionally etching back or chemical mechanical planarization of the gold to provide an electroplating gold bump on a bond pad of an integrated circuit chip according to the present invention.

FIGS. 5A–F illustrate the steps of forming an electroplated gold bump on a semiconductor device such as an integrated circuit chip according to the present invention. FIG. 5A shows an integrated circuit chip 168 having a silicon base 170 with devices formed therein and metal interconnections in a manner known to those skilled in the art. A passivation layer 172 may be formed over the upper surface of the integrated circuit chip 168 and may have an opening therein exposing a bond pad 174 which may be made from any of a variety of metal such as copper, gold, titanium but preferably is made from aluminum. As shown in FIG. 5B, a thin layer of contact metal 176 may be formed over the bond pad 174 to improve the adhesion of the gold that will be subsequently deposited over the bond pad 174. For example, a thin layer of gold may be deposited over the bond pad 174. A photoresist layer 178 is deposited over the integrated circuit chip as shown in FIG. 5C. The photoresist is patterned and portions selectively removed to provide an opening 180 down to the contact pad 174 and overlying the contact metal 176, if any (FIG. 5D). As shown in FIG. 5E, gold is electroplated down into the opening 180 formed in the photoresist and over the bond pad 174 and contact metal 176. This may be done by applying a static or pulse current through a plating bath with the wafer of chip as the cathode. Ordinarily the plating process provides a smooth flat upper surface 182 of the electroplated gold. However, if necessary gold may be etched back on the integrated circuit chip or may be chemical mechanical planarized and then the photoresist 178 removed to provide an electroplated gold bump 184 having a flat upper surface 182. The flat upper surface 182 provides an excellent surface for making a stitch bond connection to an integrated circuit chip without running the risk of damaging the integrated circuit chip as might be the case if the stitch bond was formed directly onto the bond pad 174.

Figure 6A:
FIG. 6A illustrates the step of providing a semiconductor device useful in a method of the present invention.
Figure 6B:
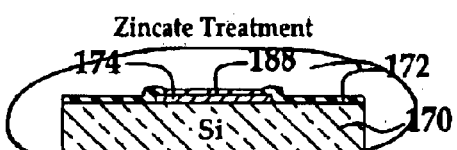
FIG. 6B illustrates the step of treating the aluminum bond pad on the integrated circuit chip with zinc according to the present invention.
Figure 6C:
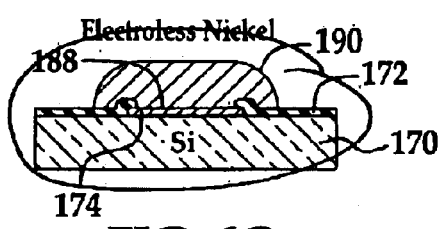
FIG. 6C illustrates the step of electroless deposition of nickel onto the bond pad on the integrated circuit chip according to the present invention.
Figure 6D:
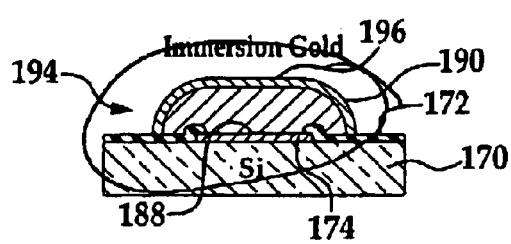
FIG. 6D illustrates the step of electroless deposition of a gold layer on the nickel formed in step 6C.

Alternatively, a wire stitch bond may be formed on a nickel/gold bump formed on a bond pad of an integrated circuit chip according to the present invention. As before, a semiconductor device such as an integrated circuit chip 168 having a silicon base 170 having devices formed therein and metal interconnects may be provided with an upper passivation layer 172. The passivation layer 172 has an opening therein to expose the bond pad 174 which may be made from a variety of metals as indicated above but preferably is an aluminum bond pad as shown in FIG. 6A. Typically the integrated circuit chip or wafer is cleaned and then the upper surface of the aluminum bond pad 174 may be treated with, for example, a zincate treatment by exposing the surface to a zincate solution for less than three minutes and then rinsing with deionized water to deposit a small layer of zinc 188 thereon as shown in FIG. 6B. As shown in FIG. 6C, the wafer is put in a nickel solution for electroless plating, for example, in 8–10 weight percent NiP at 85° C. for about 12–15 minutes to produce about five micrometers thick of nickel 190. Thereafter, the integrated circuit chip or wafer is rinsed with deionized water, and immersed in a gold solution at 80° C. for about 10 minutes to form a thin layer of gold over the nickel 190, and the integrated circuit chip or wafer is rinsed with deionized water. FIG. 6D shows an integrated circuit chip with a nickel/gold bump 194 formed over a bond pad 174. The upper surface 196 of the nickel/gold bump 194 is relatively flat and provides an excellent surface for forming a wire stitch bond thereon according to the present invention.

FIGS. 7A–D illustrate the steps of making a stitch bond on electroless nickel/gold bump or electroplated gold bump on an integrated circuit chip bond pad according to the present invention. A wire bonding apparatus 88 is provided including a capillary 90 having a through hole 92 formed therein for receiving a wire 94 which may be fed out of the capillary 90. The capillary includes a nose 96. A ball 100 is formed at the end of the wire 96 and the capillary is lowered so that the ball 100 contacts a bond pad 198 on a first device 200 which may be a semiconductor device such as an integrated circuit chip. Heat and pressure are applied by the capillary 90 which may include a light ultrasonic scrubbing action to produce a ball bond on the first contact pad 198 on the first device 200. A second device 202 is provided that may be a semiconductor device such as an integrated circuit chip having a first bond pad 204 formed thereon. An electroplated gold bump or electroless nickel/gold bump 206 is provided on the first bond pad 204 formed on the second device 202. After forming a ball bond 208 on the first device 200 the capillary is raised while it is fed out of the capillary and moved laterally to form a loop and the capillary 90 is moved to a positioned slightly offset from the electroplated gold bump or electroless nickel/gold bump 206. The capillary 90 is lowered so that the nose 96 presses the wire 94 against the electroplated gold bump or electroless nickel/ gold bump 206 and ultrasonic vibration of the capillary 90 causes the wire to be stitch or wedge bonded to the electroplated gold bump or electroless nickel/gold bump 206. Thereafter, wire clamps 98 are closed against the wire and the capillary 90 is raised to break the wire off leaving a stitch bond 210 on the electroplated gold bump or electroless nickel/gold bump 206 attached to the first bond pad 204 on the second integrated circuit chip 202.

What is claimed is:

1. A microelectronic assembly comprising:
a first semiconductor device having a first bond pad formed thereon and a first passivation layer over at least a portion of the first semiconductor device, and wherein the first passivation layer includes a portion overlying the first bond pad and an opening formed in the first passivation layer down to the first bond pad, and a first raised electrical contact feature formed over the first bond pad and wherein the first raised electrical contact feature fills the opening formed in the first passivation layer and the first raised electrical contact feature including a substantially flat upper surface, and a first wire having a first end stitch bonded to the substantially flat upper surface of the first raised feature.

2. A microelectronic assembly as set forth in claim 1 wherein the first semiconductor device comprises a first integrated circuit chip.

3. A microelectronic assembly as set forth in claim 1 further comprising a first substrate having a second bond pad formed thereon, and wherein the first wire includes a second end bonded to the second bond pad on the first substrate.

4. A microelectronic assembly as set forth in claim 1 further comprising a second semiconductor device having a second bond pad formed thereon, and wherein the first wire includes a second end bonded to the second bond pad on the second semiconductor device.

5. A microelectronic assembly as set forth in claim 4 wherein the second semiconductor device comprises a second integrated circuit chip.

6. A microelectronic assembly as set forth in claim 5 further comprising a second raised electrical contact feature formed over the second bond pad and a second passivation layer over at least a portion of the second semiconductor device, and wherein the second passivation layer includes a portion overlying the second bond pad and an opening formed in the second passivation layer down to the second bond pad, and wherein the second raised electrical contact feature fills the opening formed in the second passivation layer and the second raised electrical contact feature including a substantially flat upper surface.

7. A microelectronic assembly as set forth in claim 6 wherein the first wire includes a second end stitch bonded to the substantially flat upper surface of the second raised feature on the second integrated circuit chip.

8. A microelectronic assembly as set forth in claim 1 further comprising a first substrate.

9. A microelectronic assembly as set forth in claim 8 wherein the first substrate comprises a ball grid array.

10. A microelectronic assembly as set forth in claim 1 further comprising a second semiconductor device attached to the first semiconductor device, and wherein the second semiconductor device includes a second bond pad formed thereon, and a third raised electrical contact feature formed on the second bond pad of the second semiconductor device, and wherein the third raised feature comprises an electroplated bump comprising gold or an electroless bump comprising a first layer comprising nickel and a second layer comprising gold.

11. A microelectronic assembly as set forth in claim 10 wherein the first wire further includes a second end stitch bonded to the third raised feature on the second semiconductor device.

12. A microelectronic assembly as set forth in claim 10 further comprising a first substrate, and wherein the first and second semiconductor devices are mounted on the first substrate.

13. A microelectronic assembly as set forth in claim 10 wherein the first substrate further includes a second bond pad formed thereon and wherein the first wire further includes a second end bonded to the second bond pad on the first substrate.

14. A microelectronic assembly as set forth in claim 10 further comprising a second wire having a first end stitch bonded to the third raised feature on the second semiconductor device.

15. A microelectronic assembly as set forth in claim 14 wherein the second wire further includes a second end bonded to the second bond pad on the first substrate.

16. A microelectronic assembly as set forth in claim 15 wherein the second end of the second wire is ball bonded to the second bond pad of the first substrate.

17. A microelectronic assembly as set forth in claim 15 wherein the second end of the second wire is wedge bonded to the second bond pad on the first substrate.

18. A microelectronic assembly as set forth in claim 11 wherein the second semiconductor device comprises an integrated circuit chip.

19. A microelectronic assembly as set forth in claim 10 wherein the first wire further includes a second end ball bonded to a second bond pad on the second semiconductor device.

20. A microelectronic assembly as set forth in claim 10 wherein the first wire comprises a gold based material.

21. A microelectronic assembly as set forth in claim 17 wherein the second wire comprises a gold based material.

22. A microelectronic assembly comprising:
a first semiconductor device having a first bond pad formed thereon and a first raised electrical contact feature formed over the first bond pad and wherein the first raised electrical contact feature includes a substantially flat upper surface, and a first wire having a first end stitch bonded to the substantially flat upper surface of the first raised feature, and wherein the first raised feature comprises an electroless bump comprising a first layer comprising nickel and a second layer comprising gold.

23. A microelectronic assembly comprising:
a first semiconductor device having a first bond pad formed thereon, a contact metal layer overlying the first bond pad and a first raised electrical contact feature formed over the contact metal layer and wherein the first raised electrical contact feature includes a substantially flat upper surface, and a first wire having a first end stitch bonded to the substantially flat upper surface of the first raised feature, and wherein the first raised feature comprises electroplated gold.

24. A microelectronic assembly as set forth in claim 23 further comprising a first passivation layer over at least a portion of the first semiconductor device, and wherein the first passivation layer includes a portion overlying the first bond pad and an opening formed in the first passivation layer down to the first bond pad, and wherein the first raised electrical contact feature fills the opening formed in the first passivation layer and overlies a portion of the first passivation layer overlying the first bond pad.

* * * * *